(12) United States Patent
Rodal et al.

(10) Patent No.: US 6,356,602 B1
(45) Date of Patent: Mar. 12, 2002

(54) RF INTEGRATED CIRCUIT FOR DOWNCONVERTING A GPS SIGNAL

(75) Inventors: Eric B. Rodal, Morgan Hill; Chung Y. Lau, Sunnyvale; Reed A. Parker, Saratoga; Gary L. Wagner, Menlo Park, all of CA (US)

(73) Assignee: Trimble Navigation Limited, Sunnyvale, CA (US)

( * ) Notice: Subject to any disclaimer, the term of this patent is extended or adjusted under 35 U.S.C. 154(b) by 0 days.

(21) Appl. No.: 09/073,207

(22) Filed: May 4, 1998

(51) Int. Cl.[7] .............................................. H04L 27/06
(52) U.S. Cl. ...................................................... 375/344
(58) Field of Search ................................. 375/347, 151, 375/344, 316; 342/357; 455/183.1, 164.1, 173.1, 192.2, 182.2, 182.1, 333, 456; 333/227–233, 13, 197

(56) References Cited

U.S. PATENT DOCUMENTS

| | | |
|---|---|---|
| 4,672,629 A | 6/1987 | Beier |
| 5,187,450 A | 2/1993 | Wagner et al. |
| 5,311,149 A | 5/1994 | Wagner et al. |
| 5,402,347 A | 3/1995 | McBurney et al. |
| 5,420,592 A * | 5/1995 | Johnson ....................... 342/357 |
| 5,564,098 A | 10/1996 | Rodal et al. |
| 5,640,133 A * | 6/1997 | MacDonald et al. ......... 333/197 |
| 5,666,093 A * | 9/1997 | D'Ostilio ..................... 333/207 |
| 5,825,887 A * | 10/1998 | Lennen ........................ 342/357 |
| 5,910,756 A * | 6/1999 | Ella ............................. 333/133 |
| 5,923,287 A * | 7/1999 | Lennen ........................ 342/357 |
| 5,943,363 A * | 8/1999 | Hanson et al. ............... 375/147 |
| 6,115,595 A * | 9/2000 | Rodal et al. ................. 455/333 |
| 6,122,506 A * | 9/2000 | Lau et al. .................... 455/427 |

* cited by examiner

Primary Examiner—Tesfaldet Bocure
(74) Attorney, Agent, or Firm—David R. Gildea

(57) ABSTRACT

A GPS receiver and an RF GPS integrated circuit for receiving a GPS signal. The GPS integrated circuit includes a synthesizer for generating LO signals, first and second downconverters for using the LO signals for downconverting the GPS signal, and a sampler for providing in-phase and quadrature phase sampled output signals representative of the GPS signal. The synthesizer includes a multi-mode divider for providing substantially the same first LO frequency at about the midpoint of the L1 and L2 GPS lo frequencies for either of two reference frequencies. The RF GPS integrated circuit uses an entirely on-chip voltage controlled oscillator (VCO) having a resonator for generating the LO signals and an entirely on-chip filter for filtering a first intermediate frequency signal.

32 Claims, 5 Drawing Sheets

RF INTEGRATED CIRCUIT FOR DOWNCONVERTING A GPS SIGNAL

BACKGROUND OF THE INVENTION

1. Field of the Invention

The invention relates generally to GPS receivers and ore particularly to RF GPS integrated circuits for downconverting a GPS satellite signal.

2. Description of the Prior Art

Global Positioning System (GPS) receivers determine location, velocity, and time by receiving and processing information in GPS signals received from GPS satellites that have been placed in orbit around the Earth by the United States Government. Each GPS satellite uses a distinct pseudo-random noise (prn) code for spreading data for the location-in-space and time-of-transmission for that satellite and transmits the spread data on a carrier frequency that is the same for all the satellites. A GPS receiver uses the distinct prn code for distinguishing the GPS signals from typically at least four satellites and then finds its own location, velocity, and time by solving simultaneous equations using the relative times that the signal from each of the satellites arrives at the receiver and the locations-in-space and times-of-transmission from the satellites.

There is a need for improving the performance of GPS receivers in terms of accuracy, acquisition and tracking of low level signals, acquisition time, and immunity to interference. And, there is a need for reducing the size, power consumption, and cost of the GPS receiver. One of the major components in determining the performance, size, power, and cost in the GPS receiver is the radio frequency (RF) circuitry at the front end for downconverting the GPS satellite carrier frequency to an intermediate or baseband frequency. Due to the relatively high frequency of the GPS satellite signal, most GPS receivers until recently have used discrete components for the front end RF circuitry. Although the performance of such RF circuitry may be very good, these discrete components represent a large portion of the size, power, and cost of a modern GPS receiver. Gallium Arsenide (GaAs) integrated circuits (IC)s have been developed using field effect transistors (FET)s as active devices for replacing the majority of the discrete components in the RF circuitry. Unfortunately, GaAs ICs have been and continue to be relatively expensive because the commercial manufacturing volume of GaAs ICs is low and because the GaAs material is more expensive than Silicon and the processing steps in manufacturing a GaAs IC are relatively difficult. Silicon bipolar ICs using bipolar transistors as active devices have been used for the front end RF circuitry in the GPS receiver. Such ICs can be more difficult to design because the frequency response, noise figure, and power consumption for the silicon IC bipolar transistors are typically not as good as for the GaAs IC FETs. However, the silicon bipolar ICs are less costly and have recently been shown to have sufficient performance for most applications. There continues to be a need for improvements in RF ICs in order to improve performance and reduce size, power consumption, and cost in a GPS receiver.

Existing RF ICs for GPS downconversion require at least a few discrete external components in addition to the IC in order to operate. These external components increase the size and expense of the receiver and typically also increase the power consumption because more current is required to drive an external component through an output interface and an external path than would be required to drive the same component if it were inside the chip. For example, existing RF GPS IC downconverters use a voltage controlled oscillator (VCO) having an off-chip resonator for downconverting the GPS signal to a first intermediate frequency signal. Other existing RF GPS IC downconverters avoid the need for a resonator by constructing the VCO of a ring of amplifiers or gates. However, such ring-type VCO has increased phase noise as compared with a VCO having a resonator. For another example, existing RF GPS IC downconverters use an off-chip filter for filtering the first intermediate frequency signal. Although it is known to be desirable for the VCO resonator and the filter to be integrated into the IC, existing RF bipolar ICs have not done so because the known techniques require prohibitively large surface areas which would increase the cost of the IC. There is a need for an RF GPS downconversion IC having an entirely on-chip first intermediate frequency filter and/or VCO without substantially increasing the size and thereby the cost of the IC.

SUMMARY OF THE INVENTION

It is therefore an object of the present invention to provide a radio frequency (RF) GPS integrated circuit (IC) downconverter using an entirely on-chip first intermediate frequency filter.

Another object of the present invention is to provide an RF GPS IC downconverter using an entirely on-chip voltage controlled oscillator (VCO) using a resonator for downconverting a GPS signal.

Briefly, in a preferred embodiment, a GPS receiver of the present invention includes a narrow bandpass radio frequency (RF) filter for filtering a GPS signal at the GPS satellite signal frequency, an RF GPS integrated circuit (IC) of the present invention for receiving the filtered GPS signal and issuing a downconverted signal, a GPS digital signal processor (DSP) for receiving the downconverted signal and issuing a correlation signal, and a microprocessor system for processing the correlation signal and providing a GPS-based location. The RF GPS IC includes a synthesizer for providing a first local oscillator (LO) signal and a complex second LO signal, a first downconverter using the first LO signal for converting a GPS L1 or L2 frequency signal to a first intermediate frequency (IF) signal, a second downconverter using the second LO signal for converting the first IF signal to a complex second IF signal, and a sampler for sampling the second IF signal and issuing I and Q sampled signals. The RF filter is tuned for passing a narrow band about the L1 frequency or the L2 frequency before the GPS signal reaches the RF GPS IC. The first downconverter includes an entirely on-chip filter for filtering the unwanted frequencies from the first IF signal. The synthesizer includes an entirely on-chip phase locked voltage controlled oscillator (VCO) using an on-chip transformer and variable capacitors for a tunable resonator for generating the first LO signal at a frequency of about the mid-point of the L1 and L2 frequencies so that the first and second intermediate frequencies are substantially the same for the L1 or L2 frequencies by using mixing products for frequency differences where the incoming GPS signal is higher or lower, respectively, than the frequency of the LO signal. The synthesizer further includes an amplifier/oscillator for selectably receiving an external reference signal at a reference frequency of about thirteen megahertz or generating an internal reference signal using an external resonator at a historically common GPS reference frequency about twelve and one-half megahertz; and a multi-mode divider for frequency dividing the second LO signal by a first or a second divide number so that the first and second LO frequencies do not change significantly when the reference frequency is changed. The first divide number is a ratio formed by alternating two integer divide numbers in repeating sequences.

An advantage of an RF GPS IC downconverter of the present invention is that cost, size, and power consumption of a GPS receiver are reduced by using a narrow band RF filter and an RF GPS IC downconverter having an entirely on-chip intermediate frequency filter.

Another advantage of the present invention is that the size, cost, and power consumption of a GPS receiver are reduced by using an RF GPS IC downconverter having an entirely on-chip voltage controlled oscillator (VCO) using an on-chip resonator.

These and other objects and advantages of the present invention will no doubt become obvious to those of ordinary skill in the art after having read the following detailed description of the preferred embodiments which are illustrated in the various figures.

IN THE DRAWINGS

DETAILED DESCRIPTION OF THE PREFERRED EMBODIMENTS

Figure 1:
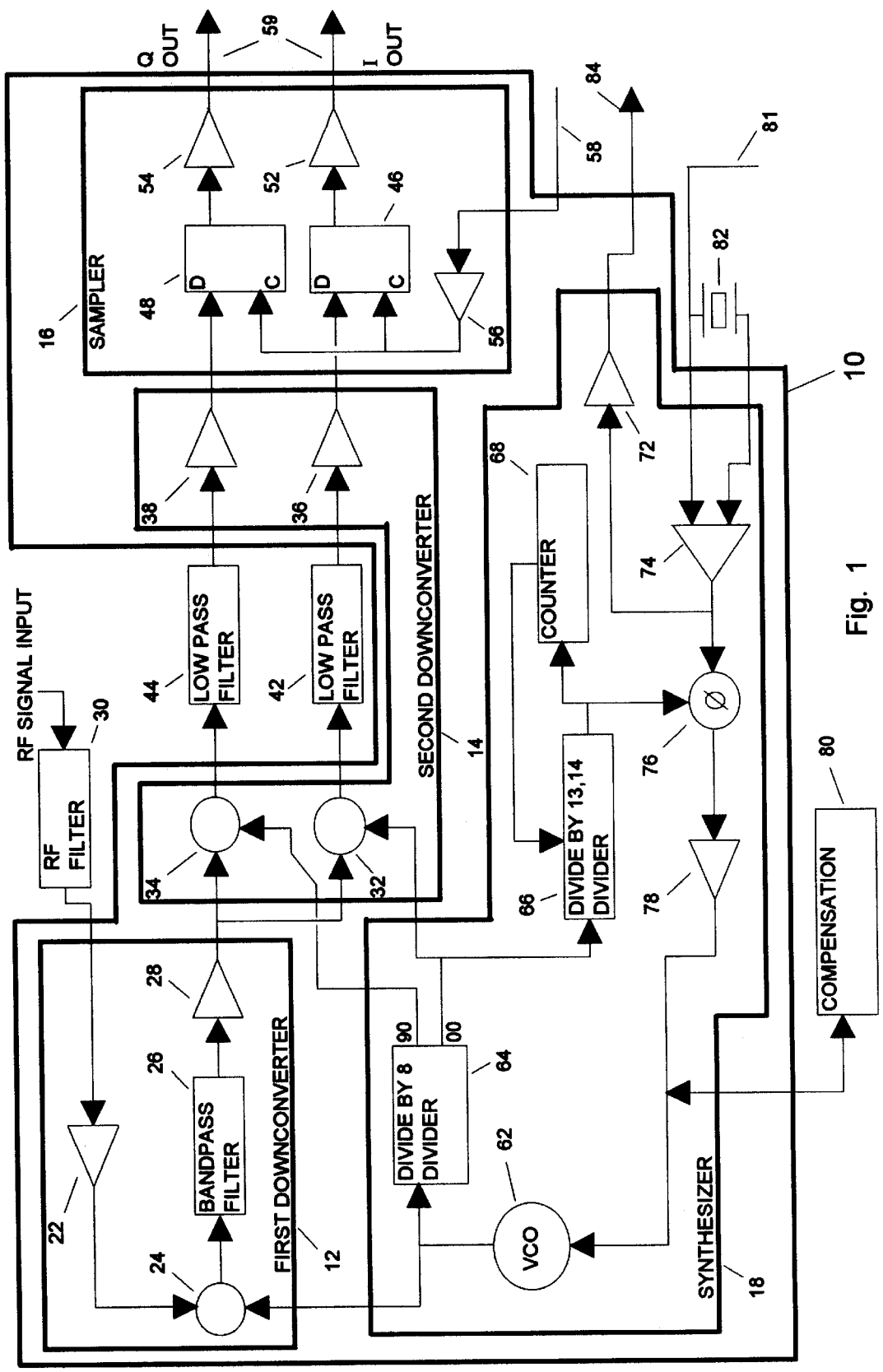
FIG. 1 is a block diagram of an RF GPS integrated circuit downconverter of the present invention.

FIG. 1 illustrates a radio frequency (RF) integrated circuit of the present invention referred to by the general reference number 10 for receiving a global positioning system (GPS) signal. The RF GPS integrated circuit 10 includes a first downconverter 12, a second downconverter 14, a sampler 16, and a synthesizer 18. The first downconverter 12 includes a low noise amplifier (LNA) 22, a mixer 24, a bandpass filter 26, and an amplifier 28 for receiving a radio frequency input signal. Typically, the RF signal passes through an RF filter 30 before reaching the integrated circuit 10. The LNA 22 receives an RF input signal from outside the integrated circuit 10 and passes an amplified RF signal to the mixer 24. The mixer 24 uses a first local oscillator ($LO_1$) signal received from the synthesizer 18 to downconvert the frequency of the amplified RF signal and passes the downconverted signal to the bandpass filter 26. The bandpass filter 26 uses poles on the real axis for filtering the downconverted signal and passes a filtered signal to the amplifier 28. The amplifier 28 amplifies the filtered signal and passes the amplified signal as a first intermediate frequency (IF) signal the second downconverter 14.

The second downconverter 14 includes a pair of mixers 32 and 34 and a pair of amplifiers 36 and 38. The first IF signal is split and passed to each of the mixers 32 and 34. The mixer 32 uses an in-phase (I) component of a complex second local oscillator ($LO_2$) signal received from the synthesizer 18 to frequency downconvert the first IF signal to an I channel second IF signal; and the mixer 34 uses a quadrature (Q) component of the complex $LO_2$ signal received from the synthesizer 18 to frequency downconvert the first IF signal to a Q channel second IF signal. The I and Q channels of the complex second IF signal are passed off chip through low pass filters 42 and 44 and received back on chip to the amplifiers 36 and 38. The amplifiers 36 and 38 amplify the signals and pass the I and Q signals to the sampler 16.

The sampler 16 includes a pair of D flip-flops 46 and 48, a pair of output amplifiers 52 and 54, and a clock input amplifier 56. The clock input amplifier 56 amplifies a sampling clock input signal on a path 58 and passes the amplified clock signal to clock inputs (C) of the D flip-flops 46 and 48. The D flip-flops 46 and 48 receive the I and Q second IF signal components at D inputs and use an edge of the amplified clock signal for providing sampled I and Q signals at I and Q outputs, respectively. The sampled I and Q signals are amplified by the output amplifiers 52 and 54 and then passed out of the integrated circuit 10 as I and Q output signals.

The synthesizer 18 includes a voltage controlled oscillator 62, a divide-by-eight divider 64, a divide-by-thirteen, fourteen divider 66, a counter 68, a clock output amplifier 72, a reference amplifier/oscillator 74, a phase detector ($\phi$) 76, and an error voltage amplifier 78. The divide-by-eight divider 64 uses a divide-by-two divider followed by a divide-by-four Johnson counter to establish a fixed 90° phase offset. The VCO 62, the divider 64, the divider 66, the phase detector 76, the error voltage amplifier 78, and an off-chip compensation circuit 80 act as a phase lock loop to synchronize the frequency of the $LO_1$ and $LO_2$ signals to a reference signal on a path 81 having a reference frequency of either thirteen megahertz or twelve point five zero four (12.504) megahertz. The VCO 62 generates the $LO_1$ signal having a frequency controlled by an amplified error voltage signal provided by the error voltage amplifier 78. The $LO_1$ signal is frequency divided by eight by the divider 64 and split into the $LO_2$ I (0°) and Q(90°) components used in the second downconverter 14. The $LO_2$ I component is frequency divided by either thirteen or fourteen in the divider 66 as controlled by a divide selection signal from the counter 68. The divider 66 then passes a frequency divided feedback signal to the counter 68 and the phase detector 76.

The reference amplifier/oscillator 74 uses positive feedback around a differential amplifier for generating the reference signal or uses the differential amplifier for amplifying an externally generated reference signal. For operation as an oscillator, a crystal resonator 82 having a desired resonant frequency is connected between two emitter coupled inputs to the amplifier/oscillator 74. For operation as an amplifier the inputs of the amplifier/oscillator 74 receive the externally generated reference signal on the path 81. The reference amplifier/oscillator 74 passes the reference signal to the phase detector 76. The phase detector 76 provides an error voltage proportional to a difference in phases between the amplified reference signal and the feedback signal received from the divider 66 The compensation circuit uses a capacitor or a combination of one or more capacitors and/or resistors for frequency stability by adding the appropriate poles and zeros for stabilizing the loop. The clock output amplifier 72 receives the reference signal from the reference amplifier/oscillator 74 and issues a reference signal output on a path 84.

The integrated circuit 10 has a first mode using the thirteen megahertz reference frequency and a second mode using the twelve point five zero four megahertz reference frequency. The feedback signal provided by the divider 66 is a pulse stream having an average pulse rate that is driven by the action of the loop to match the frequency of the reference signal. The divide select signal provided by the counter 68 causes the divider 66 to divide by thirteen or by fourteen. In the first mode the counter 68 counts the frequency divided signal from the divider 66 to fifteen and provides a divide select signal causing the divider 66 to frequency divide the $LO_2$ frequency in repeating sequences of 13, 14, 13, 14, 13, 14, 13, 14, 13, 14, 13, 14, 13, 14, and 13. The average divide number in the divider 66 is found by dividing the sum of thirteen times eight plus fourteen times seven by the sum of eight plus seven. Generalized equation 1 below shows the average divide number.

$$\text{Average divide number} = (A_N * A_t + B_N * B_t)/(A_t + B_t) \quad (1)$$

In the equation 1, in a preferred embodiment where $A_N$ is thirteen, $A_t$ is eight, $B_N$ is fourteen, and $B_t$ is seven, the average divide number equals two-hundred two divided by fifteen (202/15) or thirteen point four followed by sixes (13.466666). Accordingly, in the first mode, the $LO_2$ signal has a nominal frequency of about 175.067 megahertz and the is $LO_1$ signal has a nominal frequency of about 1400.533 megahertz. In the second mode the counter 68 provides the divide selection signal having the second logic level thereby controlling the divider 66 to divide by fourteen. Accordingly, in the second mode $LO_2$ signal has a nominal frequency of 175.056 megahertz and the $LO_1$ signal has a nominal frequency of 1400.448 megahertz. For an L1 GPS frequency of 1575.42 megahertz, the first downconverted signal has a center frequency of approximately 174.887 megahertz or 174.972 megahertz for the first and second modes, respectively; and the second downconverted signal has a center frequency of approximately 180 kilohertz or 84 kilohertz for the first and second modes, respectively. For an L2 GPS frequency of 1227.60 megahertz, the first downconverted signal has a center frequency of approximately 172.933 megahertz or 172.848 megahertz for the first and second modes, respectively, and the second downconverted signal has a center frequency of 2.13 megahertz or 2.21 megahertz in the first and second modes, respectively. Importantly, the center frequencies of the first IF signals for the L1 and L2 GPS frequencies for either reference frequency are close enough to enable the integrated circuit to use a single bandpass filter 26 and the second IF frequency is low enough for the sampled signals to be inexpensively processed by a following digital processor. It will be appreciated that the above scheme is not limited to an average divide number of two-hundred two divided by fifteen or for reference frequencies of only thirteen and twelve point five zero four megahertz. The sampling clock input signal received on the path 58 from a GPS digital signal processor (DSP) section 86 (FIG. 2) has a frequency lo equal or harmonically related to the reference frequency. In a preferred embodiment the frequency is ½ the reference frequency or 3.25 megahertz or 3.126 megahertz for the first and second modes, respectively.

The RF filter 30 for receiving the GPS signal has a narrow passband of about ten megahertz for one decibel of attenuation and a steep stop band of about forty to forty-five megahertz for fifty decibels of attenuation. The RF filter 30 may be constructed from a surface acoustic wave (SAW) device at the GPS L1 RF frequency of 1575.42 megahertz or the GPS L2 frequency of 1227.60 megahertz. Model L705D from Siemens Matsushita Components of Munich, Germany, is commercially available for such filter 30 at 1575.42 megahertz. The combination of the narrow passband of the RF filter 30 and the complex I and Q output signals for processing in the GPS DSP section 86 (FIG. 2) enable the integrated circuit 10 to use a wider bandwidth in the filter 26, thereby enabling the bandpass filter 26 to use integrated circuit technology and be placed on-chip. The combination of the closeness of the frequencies and the on-chip filter 26 provide a cost efficient solution to the problem for downconverting either one of the L1 and L2 GPS frequencies with either one of two reference frequencies.

Figure 2:
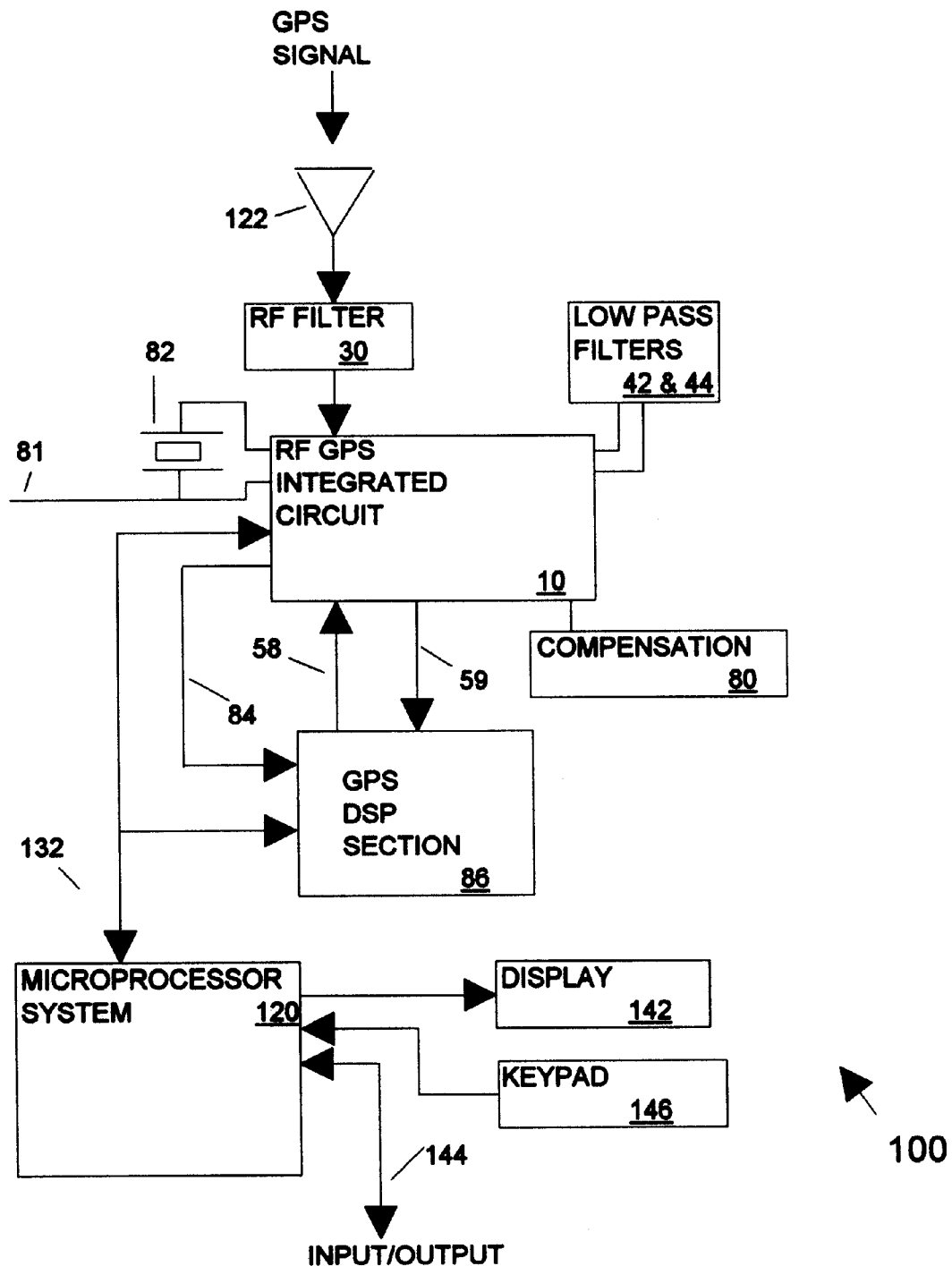
FIG. 2 is a block diagram of a GPS receiver using the RF GPS integrated circuit of FIG. 1.

FIG. 2 illustrates a global positioning system receiver of the present invention referred to by the general reference number 100. The GPS receiver 100 includes the RF GPS integrated circuit 10, the RF filter 30, the low pass filters 42 and 44, the compensation 80, and the crystal resonator 82 as described in detail in the description accompanying FIG. 1; and includes the GPS DSP section 86, a microprocessor system 120, and a GPS antenna 122. The external reference signal on the path 81 is received by the RF GPS integrated circuit 10 from an internal or external signal source. The integrated circuit 10 then selects the external reference signal or generates the reference signal using the resonator 82 and distributes the selected reference signal through the path 84 to the GPS DSP section 86, thereby enabling the same RF GPS integrated circuit 10 and GPS receiver 100 to use either one of two frequencies as a reference. Preferably, the GPS DSP section 86 divides the reference signal from the path 84 by four and returns the divided signal back to the RF GPS integrated circuit 10 through the path 58 as the sampling clock input signal. Alternatively, the GPS DSP section 86 may return the sampling clock input signal back to the RF GPS integrated circuit 10 at another harmonically related frequency or at the same frequency.

The GPS antenna 122 receives a GPS RF signal and passes the signal through the RF filter 30 to the RF GPS integrated circuit 10. The RF GPS integrated circuit 10 downconverts the RF signal to representative I and Q low frequency signals as described above and then issues the I and Q signals. The GPS DSP section 86 receives the I and Q signals through the path 59 and cooperates with the microprocessor system 120 over a bus 132 to acquire and track the GPS signal by generating a replica signal and correlating and synchronizing the replica signal to the I and Q signals. While the GPS signal is being tracked, the GPS DSP section 86 passes correlation signals including GPS location-determination information for the health and locations-in-space, phase observations, and Doppler frequencies of the GPS satellites over the bus 132 to the microprocessor system 120. Details of the downconversion and correlation of the GPS signal are described in U.S. Pat. No. 4,672,629 entitled "Receiver for Bandspread Signals" by Beier and U.S. Pat. No. 5,402,347 entitled "Satellite Search Methods For Improving Time To First Fix In A GPS Receiver" by McBurney et al. The teachings of these patents are incorporated herein by reference. The microprocessor system 120 then uses the GPS information for calculating the location and velocity of the GPS antenna 122 and time. The processed information for location, velocity, and/or time is then passed to a display 142 for visual presentation and/or through a path 144 as a serial digital output. A user enters requests to the microprocessor system 120 through a keypad 146 or in a serial digital input through the path 144. The microprocessor system 120 includes a memory including a pre-programmed code for processing the requests and controlling the elements of the GPS receiver 100.

Figure 3:
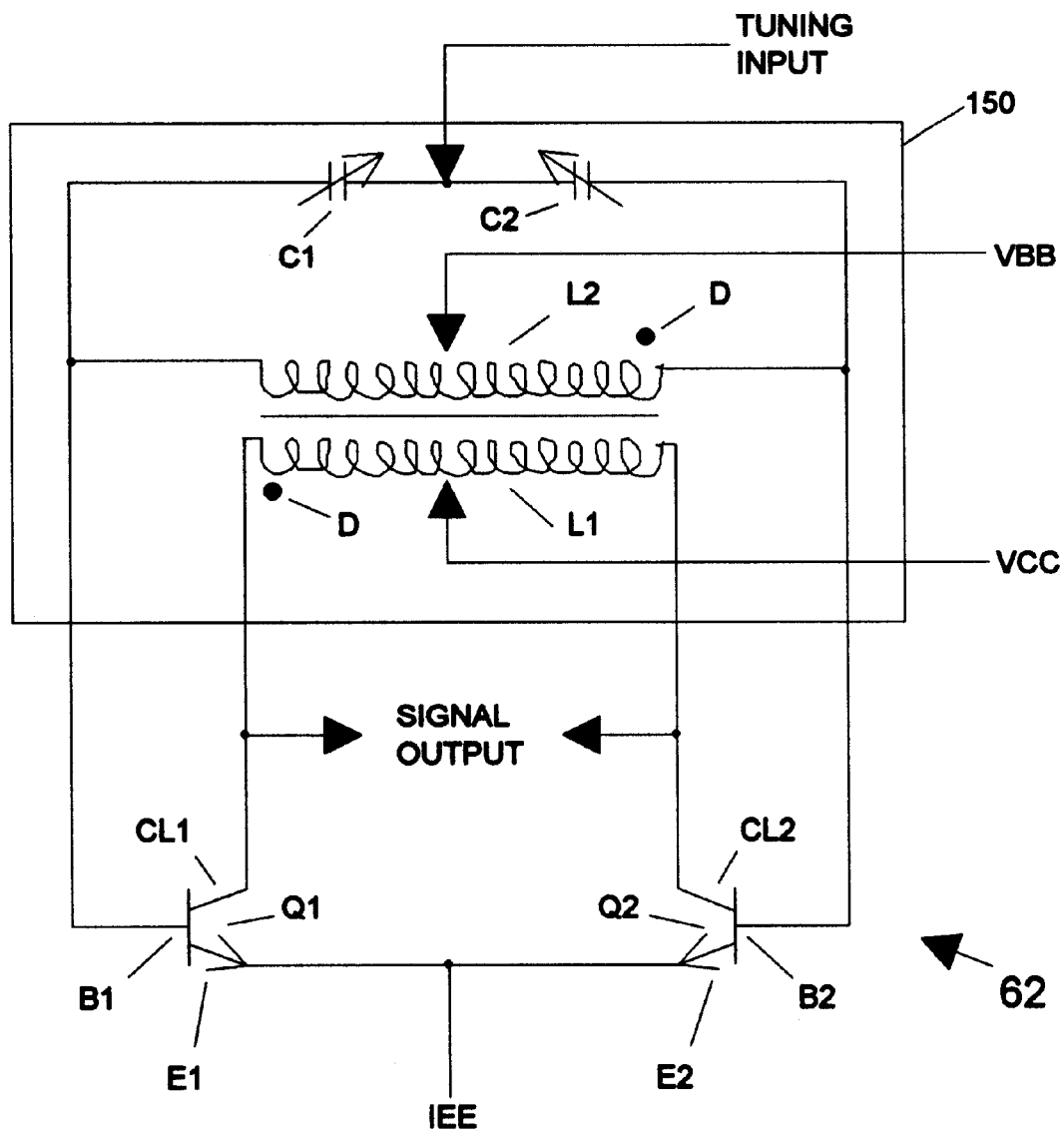
FIG. 3 is a circuit diagram of a voltage controlled oscillator of the RF GPS integrated circuit of FIG. 1.

FIG. 3 is a circuit diagram of the voltage controlled oscillator (VCO) 62. The VCO 62 includes transistors Q1 and Q2. The transistor Q1 includes a collector CL1 biased through an inductor L1 to a voltage VCC, a base B1 biased through an inductor L2 to a voltage VBB, and an emitter E1 biased with a portion of a current IEE. Similarly, the transistor Q2 includes a collector CL2 biased through the inductor L1 to the voltage VCC, a base B2 biased through the inductor L2 to the voltage VBB, and an emitter E2 biased with the other portion of the current IEE. The bias voltages VCC and VBB are connected to center taps of the inductors L1 and L2, respectively, and the transistors Q1 and Q2 receive the bias voltages VCC and VBB through outer ends of the inductors L1 and L2. The inductors L1 and L2 are mutually coupled as a transformer with polarities as shown with dots D for providing positive feedback for oscillation. Series voltage tunable capacitors C1 and C2 connect across the inductor L2 to form a resonator 150 and connect between the bases B1 and B2. The frequency of the oscillation is determined by the resonance of the inductors L1 and L2 and the capacitors C1 and C2. The capacitance of the capacitors C1 and C2 is tuned from a tuning input, corresponding to the amplified error voltage as described in the detailed description accompanying FIG. 1, in order to vary the resonant frequency. In a preferred embodiment the capacitors C1 and C2 are varactors constructed from several parallel back-biased transistors using transistor junctions between the base and the collector and emitter where the collector and emitter are connected together outside the transistors. The output signal from the VCO 62, corresponding to the $LO_1$ signal described in the detailed description accompanying FIG. 1, is taken from between collector CL1 and collector CL2.

Figure 4A:
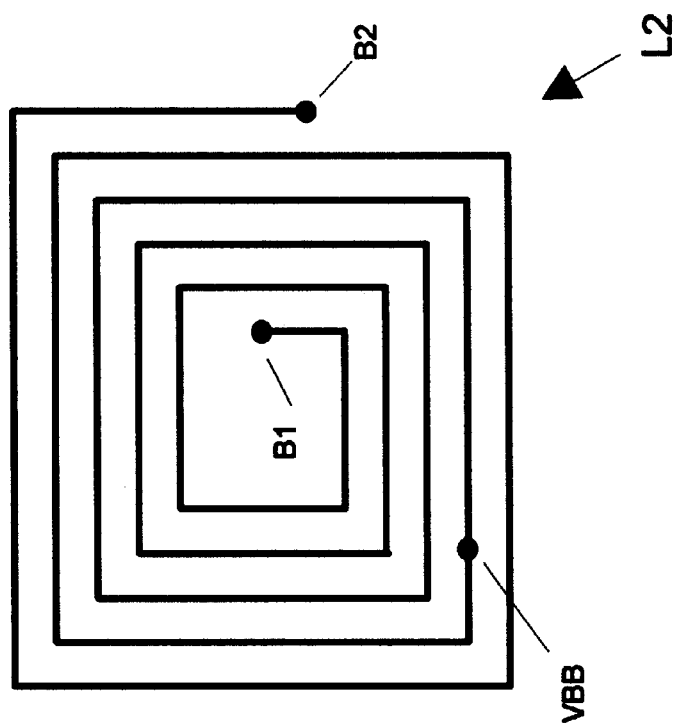
FIGS. 4a and 4b are a top view and a side view, respectively, of a transformer used in the voltage controlled oscillator of FIG. 3.
Figure 4A:
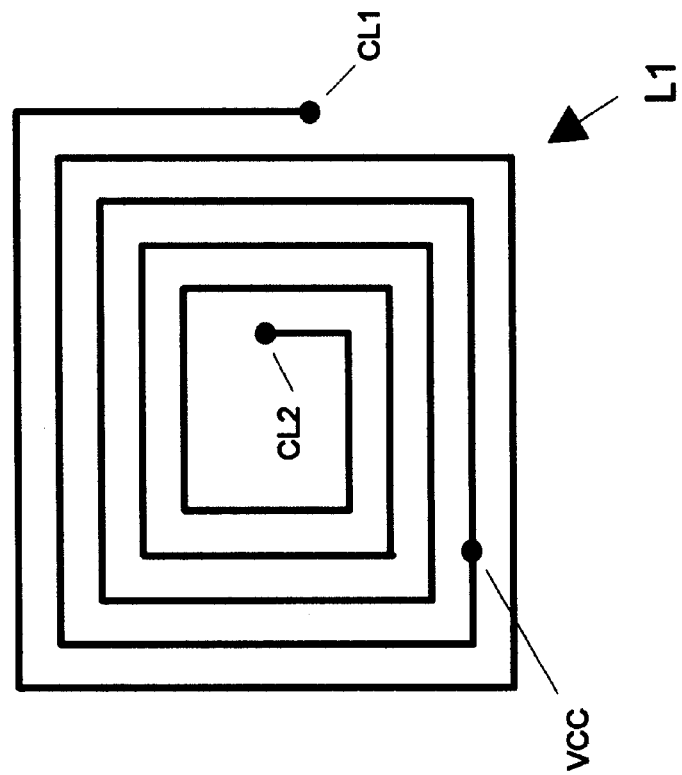
Figure 4B:
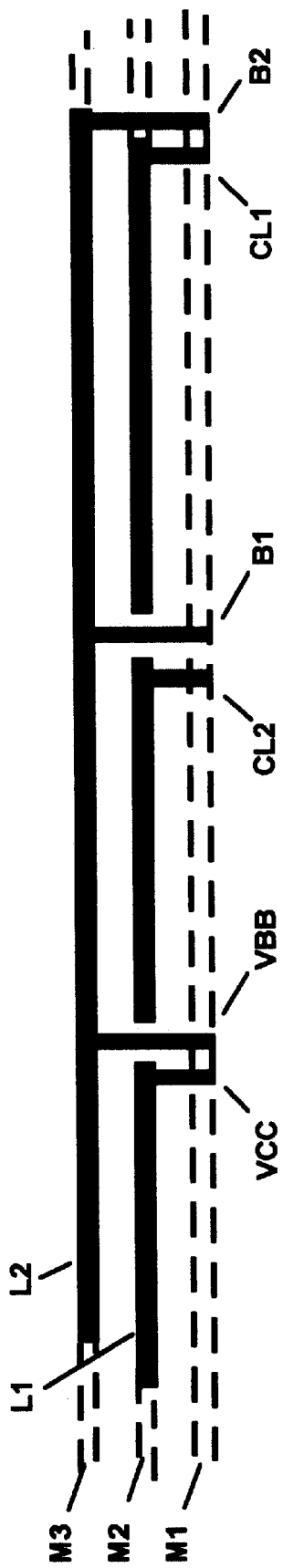

FIG. 4a is a top view illustrating the mutually coupled inductors L1 and L2. The inductors L1 and L2 are constructed as helixes where lineal lengths of the helixes are determined by the desired resonant frequencies of the VCO 62 (FIGS. 1 and 3), the capacitance tuning range of the capacitors C1 and C2 (FIG. 3), and the parasitics of the inductors L1 and L2 and the capacitors C1 and C2. The RF GPS integrated circuit 10 is constructed using three horizontal metalization layers M1, M2, and M3 (FIG. 4b). The metalization layer M1 is etched for electrical interconnections among the emitters E1 and E2 (FIG. 3), the bias current IEE (FIG. 3), the capacitors C1 and C2 (FIG. 3), the tuning input (FIG. 3), the signal output (FIG. 3), the inductors L1 and L2, the collectors CL1 and CL2, the bases B1 and B2, and the bias voltages VCC and VBB. The inductor L1 is etched into metalization layer M2 and the inductor L2 is etched into metalization layer M3. The bias VCC connects at approximately the inductive midpoint and the collectors CL1 and CL2 connect at the ends of the helix of the inductor L1. Similarly, the bias VBB connects at approximately the inductive midpoint and the bases B1 and B2 connect at the ends of the helix for the inductor L2. Preferably, the helixes for the inductors L1 and L2 have the same lineal length and area and are disposed one over the other. In order to provide the correct polarity as shown in the dots D (FIG. 3), the connection to the collector CL1 is adjacent to the connection to the base B2 and the connection to the collector CL2 is adjacent to the base B1.

FIG. 4b is a side view illustrating the horizontal metalization layers M2 and M3 including the inductors L1 and L2 and the horizontal metalization layer M1 for electrical interconnections. The inductor L1 connects to the bias VCC and the collectors CL1 and CL2 using vias in the vertical direction through adjacent layers of the integrated circuit in a conventional manner. Similarly, the inductor L2 connects to the bias VBB and the bases B1 and B2 using vias in the vertical direction through adjacent layers of the integrated circuit 10 in a conventional manner. It is not crucial which of the layers M2 and M3 has the inductor L1 and which has the inductor L2. However, in order to have a high Q, it is preferable that the metalization layer M1 is between the semi-conducting substrate of the chip and the metalization layers M2 and M3.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. Radio frequency circuitry for downconverting a global positioning system (GPS) satellite signal, comprising:

a synthesizer for providing a first local oscillator (LO) signal, the synthesizer including an amplifier/oscillator for selecting a reference signal by (i) receiving and amplifying a first reference signal having a first reference frequency from an external reference oscillator or (ii) using a resonator for generating a second reference signal having a second reference frequency not equal to said first reference frequency, and a loop for deriving said first LO signal from said selected reference signal; and a first downconverter for using said first LO signal for downconverting said GPS signal to a first intermediate frequency (IF) signal.

2. The circuitry of claim 1, wherein:

the first downconverter includes a first IF filter for filtering said first IF signal and providing a filtered first IF signal.

3. The circuitry of claim 2, wherein:

the synthesizer is further for generating a complex second LO signal having in-phase (I) and quadrature phase (Q) components at a sub-multiple frequency of said first LO signal; and further including:

a second downconverter for using said complex second LO signal for downconverting said filtered first IF signal to a complex second IF signal having in-phase (I) and quadrature phase (Q) components.

4. The circuitry of claim 3, further including:

a sampler for sampling said complex second IF signal and providing sampled in-phase (I) and quadrature phase (Q) output signals representative of said GPS signal.

5. The circuitry of claim 1, wherein:

said GPS signal is either one of an L1 GPS signal or an L2 GPS signal; and said first LO signal has a frequency approximately the midpoint of a carrier frequency of said L1 and said L2 GPS signal.

6. The circuitry of claim 1, wherein:

the circuitry is disposed entirely within a single integrated circuit.

7. The circuitry of claim 1, wherein:

said loop includes a phase detector coupled to said amplifier/oscillator for receiving said selected reference signal and providing an error signal corresponding to a phase difference between said selected reference signal and a feedback signal; a local oscillator for providing said first LO signal having a first LO frequency controlled by said error signal; and a multi-mode divider for dividing said first LO frequency by a selected one of a first divide number for providing said feedback signal having said first reference frequency or a second divide number for providing said feedback signal having said second reference frequency.

8. A method of downconverting a global positioning system (GPS) satellite signal, comprising steps of:

selecting a reference signal by (i) receiving and amplifying a first reference signal having a first reference frequency from an external reference oscillator or (ii)

using a resonator for generating a second reference signal having a second reference frequency not equal to said first reference frequency;

deriving a first LO signal from said selected reference signal; and using said first LO signal for downconverting said GPS signal and providing a first intermediate frequency (IF) signal.

9. The method of claim 8, further comprising a step of:

filtering said first IF signal for providing a filtered first IF signal.

10. The method of claim 8, further including steps of;

generating a complex second LO signal having in-phase (I) and quadrature phase (Q) components at a sub-multiple frequency of said first LO signal; and using said complex second LO signal for downconverting said filtered first IF signal to a complex second IF signal having in-phase (I) and quadrature phase (Q) components.

11. The method of claim 10, further including:

sampling said complex second IF signal for issuing sampled in-phase (I) and quadrature phase (Q) output signals having information representative of information carried on said GPS signal.

12. The method of claim 8, wherein:

said GPS signal is either one of an L1 GPS signal or an L2 GPS signal; and said first LO signal has a frequency approximately the midpoint of a carrier frequency of said L1 and said L2 GPS signal.

13. The method of claim 8, wherein:

the step of deriving said first LO signal from said selected reference signal includes steps of:

comparing a phase of said selected reference signal to a feedback signal for providing an error signal;

using said error signal for controlling a first LO frequency of said first LO signal; and frequency dividing said first LO signal by a selected one of a first divide number for providing said feedback signal having said first reference frequency or a second divide number for providing said feedback signal having said second reference frequency.

14. Radio frequency circuitry for downconverting a global positioning system (GPS) satellite signal, comprising:

a synthesizer including a voltage controlled oscillator (VCO) including a tunable resonator for providing a first local oscillator (LO) signal; and a first downconverter for using said first LO signal for downconverting said GPS signal to a first intermediate frequency (IF) signal, wherein:

said tunable resonator includes a transformer for providing an oscillation feedback signal and resonating with tuned capacitors at a desired frequency of said first LO signal.

15. The circuitry of claim 14, wherein:

said GPS signal is either one of an L1 GPS signal or an L2 GPS signal; and said first LO signal has a frequency approximately the midpoint of a carrier frequency of said L1 and said L2 GPS signal.

16. The circuit 14 of claim 14, wherein:

the synthesizer includes an amplifier/oscillator for selecting a reference signal by (i) receiving and amplifying a first reference signal having a first reference frequency from an external reference oscillator or (ii) using a resonator for generating a second reference signal having a second reference frequency not equal to said first reference frequency; a phase detector coupled to the amplifier/oscillator for receiving said selected reference signal and providing an error signal corresponding to a phase difference between said selected reference signal and a feedback signal; a local oscillator for providing said first LO signal having a first LO frequency controlled by said error signal; and a multi-mode divider for dividing said first LO frequency by a selected one of a first divide number for providing said feedback signal having said first reference frequency or a second divide number for providing said feedback signal having said second reference frequency.

17. The circuitry of claim 16, wherein:

at least one of said first divide number and said second divide number is a ratio having an integer numerator and an integer denominator, said denominator greater than one.

18. The circuitry of claim 17, wherein:

said multi-mode divider is further for providing said feedback signal having said first reference frequency by alternately dividing said feedback signal by a divide number $A_N$ and a divide number $B_N$ in repeating sequences, each of said sequences beginning in said divide number $A_N$ and ending in said divide number $A_N$ for providing said feedback signal having said first reference frequency.

19. The circuitry of claim 18, wherein:

at least one of said first divide number and said second divide number is said divide number $B_N$.

20. The circuitry of claim 14, wherein:

said transformer includes a first horizontal helix and a second horizontal helix disposed one over the other on respective metalization layers of an integrated circuit.

21. The circuitry of claim 14, wherein:

the circuitry is disposed entirely within a single integrated circuit.

22. A method of downconverting a global positioning system (GPS) satellite signal, comprising steps of:

generating a first local oscillator (LO) signal with a voltage controlled oscillator (VCO), said VCO having a tunable resonator; and using said first LO signal for downconverting said GPS signal and providing a first intermediate frequency (IF) signal, wherein:

the step of generating said first LO signal includes steps of: coupling an oscillation feedback signal with a transformer; and tuning capacitors for providing said oscillation feedback signal by resonating with said transformer at a desired frequency of said first LO signal.

23. The method of claim 22, wherein:

said GPS signal is either one of an L1 GPS signal or an L2 GPS signal; and said first LO signal has a frequency approximately the midpoint of a carrier frequency of said L1 and said L2 GPS signal.

24. The method of claim 22, wherein:

the step of generating said first LO signal includes steps of: selecting a reference signal by (i) receiving and amplifying a first reference signal having a first reference frequency from an external reference oscillator or (ii) using a resonator for generating a second reference signal having a second reference frequency not equal to said first reference frequency; comparing a phase of said selected reference signal to a feedback signal for providing an error signal; using said error signal for controlling a first LO frequency of said first LO signal; and frequency dividing said first LO signal by a selected one of a first divide number for providing said feedback signal having said first reference frequency or a second divide number for providing said feedback signal having said second reference frequency.

25. The method of claim 24, wherein:

at least one of said first divide number and said divide number is a ratio having an integer numerator and an integer denominator, said denominator greater than one.

26. The method of claim 25, wherein:

the step of dividing said first LO frequency by said first divide number includes steps of alternately dividing by a divide number $A_N$ and a divide number $B_N$ in a sequence, said sequence beginning in said divide number $A_N$ and ending in said divide number $A_N$; and continuously repeating said sequence for providing said feedback signal having said first reference frequency.

27. The method of claim 26, wherein:

at least one of said first divide number and said second divide number is said number $B_N$.

28. The method of claim 22, wherein:

said transformer includes a first horizontal helix and a second horizontal helix disposed one over the other on respective metalization layers of an integrated circuit.

29. A global positioning system (GPS) receiver, comprising:

a radio frequency (RF) GPS section including a synthesizer including a voltage controlled oscillator (VCO) including a tunable resonator for providing a first local oscillator (LO) signal and a complex second LO signal at a sub-multiple of said first LO signal; a first downconverter for using said first Lo signal for downconverting said RF signal and providing a first intermediate frequency (IF) signal, said first downconverter including a filter for filtering said first IF signal; a second downconverter for using said second LO signal for downconverting said filtered first IF signal and providing a complex second IF signal; and a sampler for sampling said second IF signal and providing sampled in-phase (I) and quadrature phase (Q) output signals having information representative of information carried on said RF signal;

a microprocessor system for computing navigational information from GPS correlations; and a GPS digital signal processing (DSP) section coupled to the RF GPS IC for cooperating with the microprocessor system for synchronizing to said sampled I and Q output signals and providing said GPS correlations.

30. The GPS receiver of claim 29, wherein:

said RF signal is either one of an L1 GPS signal or an L2 GPS signal; and said first LO signal has a frequency approximately the midpoint of a carrier frequency of said L1 and said L2 GPS signals.

31. The GPS receiver of claim 29, wherein:

said synthesizer includes an amplifier/oscillator for selecting a reference signal by (i) receiving and amplifying a first reference signal having a first reference frequency from an external reference oscillator or (ii) using a resonator for generating a second reference signal having a second reference frequency not equal to said first reference frequency; a phase detector coupled to the amplifier/oscillator for receiving said selected reference signal and providing an error signal for a phase comparison of said selected reference signal to a feedback signal; the VCO for receiving said error signal and providing said first LO signal; and a multi-mode divider for frequency dividing said second LO signal by a selected one of a first divide number for providing said feedback signal having said first reference frequency or a second divide number for providing said feedback signal having said second reference frequency.

32. The receiver of claim 29, wherein:

the RF GPS section is disposed entirely in a single integrated circuit.

* * * * *